United States Patent
Schnabel et al.

(10) Patent No.: US 7,414,906 B2
(45) Date of Patent: Aug. 19, 2008

(54) MEMORY COMPONENT HAVING A NOVEL ARRANGEMENT OF THE BIT LINES

(75) Inventors: Florian Schnabel, Hoehenkirchen (DE); Helmut Schneider, Munich (DE)

(73) Assignee: Infineon Technologies AG, Munich (DE)

( * ) Notice: Subject to any disclaimer, the term of this patent is extended or adjusted under 35 U.S.C. 154(b) by 38 days.

(21) Appl. No.: 11/301,354

(22) Filed: Dec. 12, 2005

(65) Prior Publication Data

US 2006/0152988 A1  Jul. 13, 2006

(30) Foreign Application Priority Data

Dec. 11, 2004  (DE) .................... 10 2004 059 723

(51) Int. Cl.
*G11C 7/00* (2006.01)

(52) U.S. Cl. .................. 365/205; 365/230.03; 365/190; 365/63

(58) Field of Classification Search .................. 365/205, 365/230.03, 190, 63, 51
See application file for complete search history.

(56) References Cited

U.S. PATENT DOCUMENTS

| | | | | |
|---|---|---|---|---|
| 5,396,451 | A * | 3/1995 | Ema | 365/51 |
| 5,586,078 | A * | 12/1996 | Takase et al. | 365/230.03 |
| 6,449,182 | B1 * | 9/2002 | Ooishi | 365/63 |
| 6,603,688 | B2 | 8/2003 | Hasegawa et al. | |
| 6,711,050 | B2 * | 3/2004 | Sadakata | 365/149 |
| 2001/0028592 | A1 | 10/2001 | Sekiguchi et al. | |

* cited by examiner

*Primary Examiner*—David Lam
(74) *Attorney, Agent, or Firm*—Patterson & Sheridan, L.L.P.

(57) ABSTRACT

A memory component comprises a plurality of bit lines, on which memory cells are arranged, and a plurality of sense amplifiers, which are arranged in a row, each sense amplifier being connected to two bit lines. A bit line which is connected to a first sense amplifier in the row is arranged directly adjacent to a bit line which is connected to a second sense amplifier in the same row.

4 Claims, 3 Drawing Sheets

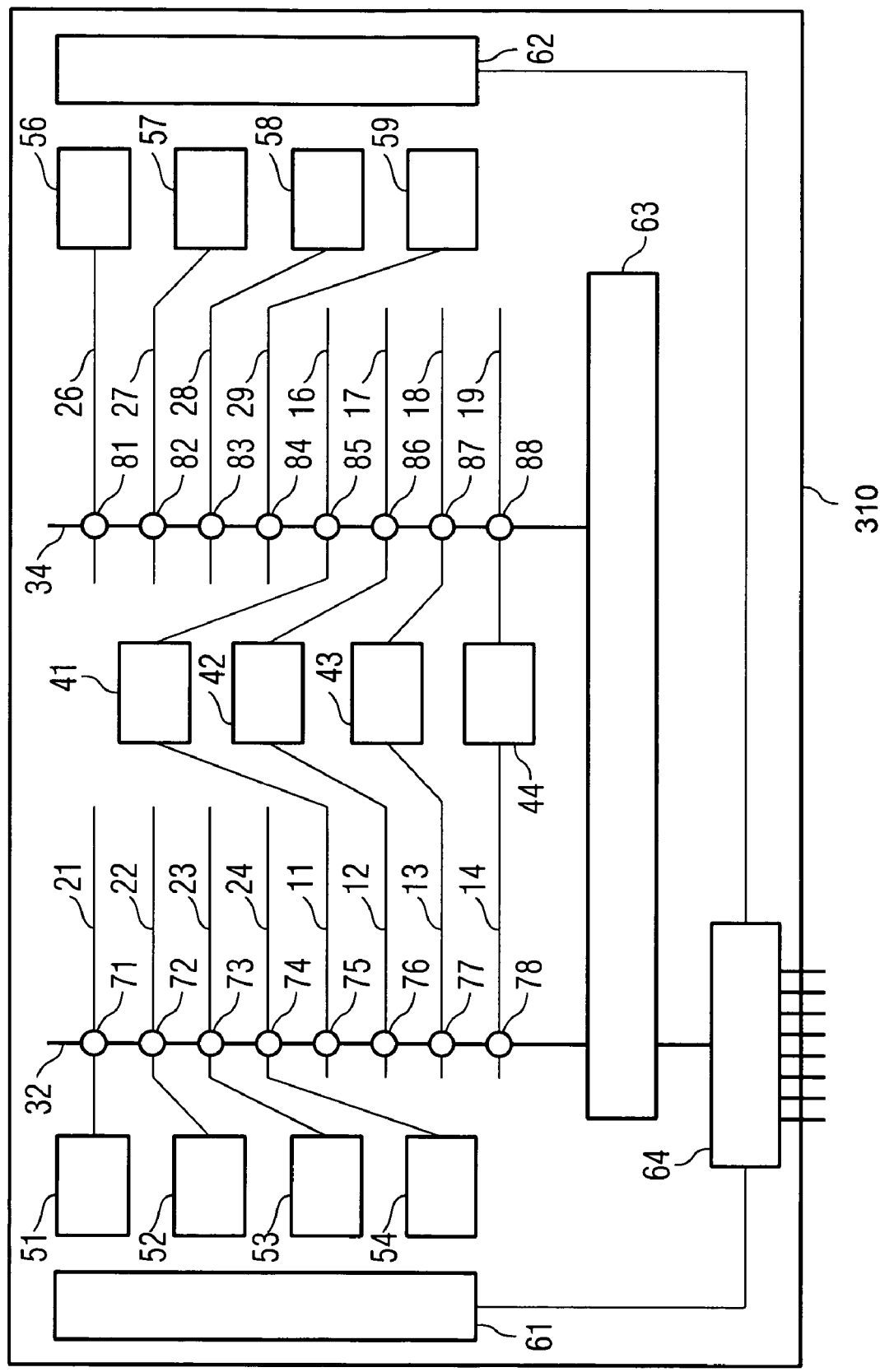

MEMORY COMPONENT HAVING A NOVEL ARRANGEMENT OF THE BIT LINES

CROSS-REFERENCE TO RELATED APPLICATIONS

This application claims foreign priority benefits under 35 U.S.C. §119 to co-pending German patent application number DE 10 2004 059 723.5-55, filed 11 Dec. 2004. This related patent application is herein incorporated by reference in its entirety.

BACKGROUND OF THE INVENTION

1. Field of the Invention

The present invention relates to a memory component and, in particular, to a memory component having a novel arrangement of the bit lines, which arrangement reduces the influence of capacitive couplings between adjacent bit lines.

2. Description of the Related Art

In dynamic random access memory (DRAM) components and other memory modules, the memory cells are arranged at crossover points between bit lines and word lines. Activating a word line or applying an appropriate signal to the word line connects each memory cell that is associated with the word line to the bit line on which it is arranged.

Reference is made below, by way of example, to a dynamic memory component. Two bit lines are respectively typically connected to a sense amplifier. The sense amplifier operates in a differential manner and compares the potentials of the two bit lines which are connected to it. Activating a word line connects one of the two bit lines to a memory cell (active bit line). The other bit line which is connected to the same sense amplifier is used as a reference bit line which does not have a memory cell connected to it at present.

Before a word line is activated, all of the bit lines are brought, in a precharge operation, to a center potential Vbleq which is between a high potential Vblh and a low potential Vbll.

After the word line has been activated, connecting the active bit line to that memory cell which is associated with the crossover point between the active bit line and the word line gives rise to a small potential difference caused by the charge stored in the memory cell. This small potential difference is amplified by the sense amplifier. In this case, one of the two bit lines assumes the high potential Vblh and the other assumes the low potential Vbll, depending on the charge or information stored in the memory cell. As a result, the charge stored in the memory cell is simultaneously refreshed.

If the memory cell is disconnected from the active bit line again as a result of the word line being deactivated, the two bit lines are precharged or brought to the center potential Vbleq again. In this case, the two bit lines which are connected to the sense amplifier are shorted together by means of a switch. If the two bit lines have approximately the same electrostatic capacitance, a potential is approximately established in the middle between the high potential Vblh and the low potential Vbll, said potential corresponding to the center potential Vbleq. In order to compensate for small asymmetries, the two bit lines are also connected, simultaneously or subsequently, to a Vbleq system via switches which are provided for this purpose, said system providing the center potential Vbleq.

A frequent defect which, on statistical average, occurs once or a number of times on each chip is a short circuit between a word line and a bit line at the crossover point between them. In the case of DRAMs, this short circuit occurs particularly frequently at the selection transistor of a memory cell. The word line involved is replaced with a redundant word line. Although the bit line involved is likewise replaced with a redundant bit line, the switches for connecting the bit lines to the Vbleq system during precharging are conventionally not driven individually. When precharging the bit lines, a bit line which has been shorted to a word line is therefore also connected to the Vbleq system. Since the word line has a potential that differs from the center potential Vbleq, the Vbleq system is subjected to loading on account of the bit line being shorted to the word line and can no longer provide precisely the center potential Vbleq.

In order to minimize the load on the Vbleq system and the induced discrepancy between the potential of the latter and the center potential Vbleq, the switches for connecting the bit lines to the Vbleq system are designed to have a high impedance. The resultant large time constant for matching the potential of a bit line to the center potential Vbleq provided by means of the Vbleq system does not constitute a disadvantage since the bit lines, as described above, are primarily approximated to the center potential Vbleq by shorting them in pairs, and only small asymmetries need to be compensated for using the high-impedance switches.

However, there are various situations in which, as a result of capacitive coupling between adjacent bit lines, there is a relatively large discrepancy between the potential of a bit line and the center potential Vbleq, which discrepancy needs to be compensated for by the Vbleq system using the high-impedance switch. Adjacent bit lines always influence one another via their capacitive coupling. It is assumed that a first bit line of a first sense amplifier is directly adjacent to a second bit line of a second sense amplifier, and a third bit line of the first sense amplifier is directly adjacent to a fourth bit line of a third sense amplifier. If the second bit line and the fourth bit line have the same potential, their influences on the first and third bit lines do not cancel one another out. After the first and third bit lines have been shorted, the latter therefore have an average potential that differs from the center potential Vbleq. The Vbleq system must compensate for this discrepancy using the high-impedance switches.

The situation described below occurs, in particular, in the case of a memory element whose bit lines are arranged in accordance with the open bit line concept. In accordance with the open bit line concept, the sense amplifiers are arranged in a plurality of parallel rows. The two bit lines which are connected to a sense amplifier extend from the latter in two opposite directions perpendicular to the rows. In the interspace between two rows of sense amplifiers, the bit lines which are connected to sense amplifiers in the two rows intermesh like two combs. To put it another way, the bit lines in an interspace are always alternately connected to a sense amplifier in one row and a sense amplifier in the other row.

Activating a word line between a first row and a second row of sense amplifiers causes all of the bit lines in the interspace between the first and second rows to become active bit lines. All of the bit lines (which are connected to sense amplifiers in the first row) in an interspace between the first row and an adjacent third row and all of the bit lines (which are connected to sense amplifiers in the second row) between the second row and an adjacent fourth row become reference bit lines. The potentials of the bit lines, which are arranged between the reference bit lines, of the sense amplifiers in the third and fourth rows are influenced by capacitive coupling to said reference bit lines. The Vbleq system must compensate for the resultant discrepancies between said potentials and the center potential Vbleq using the high-impedance switches.

SUMMARY OF THE INVENTION

The object of the present invention is to provide a memory component in which the effect of capacitive coupling between bit lines is reduced.

The present invention is based on the insight that capacitive coupling between two adjacent bit lines is particularly disadvantageous whenever only one of the two bit lines is a reference bit line or an active bit line, while the other bit line functions neither as an active bit line nor as a reference bit line. In this case, the potential shift (produced by the influence of the first bit line) of the second bit line must be compensated for by the Vbleq system using one of the abovementioned high-impedance switches.

The present invention is based on the idea of reducing the number of these situations by arranging bit lines, which are connected to sense amplifiers that are arranged in a row, in groups of two or more bit lines. As a result, at least one further bit line, which is connected to a sense amplifier in the same row, is directly adjacent to each bit line. At the same time, each bit line is directly adjacent to, at most, one further bit line which is connected to a sense amplifier in another row. Since, particularly in the open bit line concept, the above-described particularly disadvantageous situation generally arises only between bit lines which are connected to sense amplifiers in different rows, the described influence on a bit line is only half as great, at most. After grouping at least three bit lines, there are also bit lines which are not at all directly adjacent to a bit line that is connected to a sense amplifier from another row.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 shows a diagrammatic illustration of a memory component in accordance with a second exemplary embodiment of the present invention.

DETAILED DESCRIPTION OF THE PREFERRED EMBODIMENT

Figure 1:
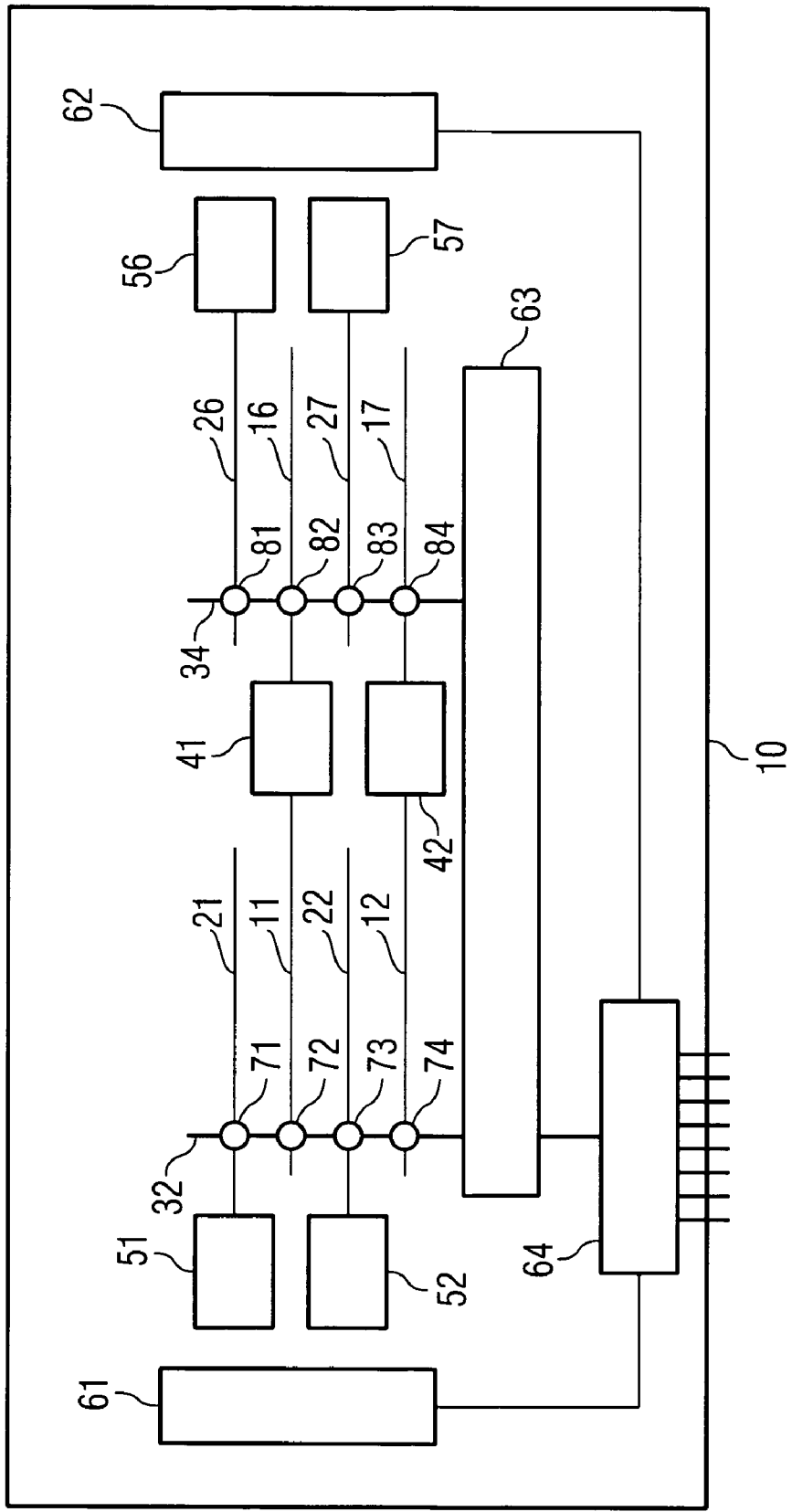
FIG. 1 shows a diagrammatic illustration of a conventional memory component.

FIG. 1 is a diagrammatic illustration of a conventional memory component 10 having a plurality of bit lines 11, 12, 16, 17, 21, 22, 26, 27 which are arranged parallel to one another. A plurality of parallel word lines 32, 34 (only two of which are illustrated) cross the bit lines 11, 12, 16, 17, 21, 22, 26, 27. A plurality of sense amplifiers 41, 42 are arranged in a first row, and further sense amplifiers 51, 52 and 56, 57 are arranged in a second and a third row, respectively. The rows in which the sense amplifiers 41, 42, 51, 52, 56, 57 are arranged are arranged parallel to one another and essentially parallel to the word lines 32, 34 and essentially perpendicular to the bit lines 11, 12, 16, 17, 21, 22, 26, 27. Each sense amplifier 41, 42 in the first row is connected to a bit line 11, 12 in an interspace between the first and second rows and to a bit line 16, 17 in an interspace between the first row and the third row. Each sense amplifier 51, 52 is connected to a bit line 21, 22 in the interspace between the first and the second row and to a further bit line (not illustrated) in an interspace between the second row and a directly adjacent fourth row (likewise not illustrated) of sense amplifiers. Each sense amplifier 56, 57 in the third row is connected to a bit line 26, 27 in the interspace between the first row and the third row and to a bit line (not illustrated) in the interspace between the third row and a directly adjacent fifth row (likewise not illustrated) of sense amplifiers.

Devices 61, 62, 63, 64 generally represent all of the other functional elements which are needed to operate a memory component and are typically integrated with the latter on a single chip, for example column and row address decoders, multiplexers and demultiplexers, input and output amplifiers and input and output buffers, etc.

Memory cells 71, 72, 73, 74, 81, 82, 83, 84 are arranged at the crossover points between the word lines 32, 34 and the bit lines 11, 12, 16, 17, 21, 22, 26, 27. If a word line 32 or 34 is activated or an appropriate activation signal is applied to the word line 32 or 34, each memory cell 71 to 74 or 81 to 84 which is connected to the word line 32 or 34 is thus connected to the associated bit line 11, 12, 21, 22 or 16, 17, 26, 27 so that its contents can be read out, refreshed or changed using the associated sense amplifiers 41, 42, 51, 52 or 41, 42, 56, 57. If the memory component 10 is a DRAM component, for example, each memory cell 71 to 74, 81 to 84 comprises a storage capacitor and a selection transistor. The stored bit (0 or 1) represents the magnitude or the sign of the charge stored in the storage capacitor. The gate electrode of the selection transistor is connected to the word line 32 or 34. Activating the word line 32 or 34 turns on the selection transistor, with the result that the storage capacitor is connected to the bit line 11, 12, 21, 22 or 16, 17, 26, 27.

To make the illustration clear, only a small number of bit lines, word lines, sense amplifiers and memory cells are respectively illustrated in FIG. 1 and in FIGS. 2 and 3 (described below). In actual fact, 500 to 1000 memory cells are typically arranged on one bit line 11, 12, 16, 17, 21, 22, 26, 27. A corresponding number of word lines 32, 34 are respectively arranged between the rows of sense amplifiers 41, 42, 51, 52, 56, 57. The number of sense amplifiers 41, 42, 51, 52, 56, 57 in each row is also typically considerably larger than illustrated in FIG. 1. The same applies correspondingly to FIGS. 2 and 3.

In order to read, write or refresh the information stored in a memory cell 71 to 74, 81 to 84, the word line 32, 34 associated with this memory cell is activated. By way of example, the word line 32 illustrated in FIG. 1 is activated, while all of the other word lines between the first row of sense amplifiers 41, 42 and the second row of sense amplifiers 51, 52 as well as all of the word lines between the first row of sense amplifiers 41, 42 and the third row of sense amplifiers 56, 57 are not activated. Each sense amplifier 41, 42 in the first row is thus connected to precisely one memory cell 72, 74 by means of a bit line 11, 12. Each sense amplifier 41, 42 compares the potentials of the two bit lines 11, 12, 16, 17 which are connected to it respectively and amplifies this potential difference. One bit line 11, 12, 16, 17 at each sense amplifier 41, 42 therefore has a high potential Vblh, while the respective other bit line 11, 12, 16, 17 has a low potential Vbll. The bit line 11, 12 which is connected to a memory cell 72, 74 is referred to as an active bit line, while the respective other bit line 16, 17 which is connected to the same sense amplifier 71, 72 is referred to as a reference bit line.

If, as described, the word line 32 is activated, all of the bit lines 11, 12, 16, 17, 21, 22 which are connected to a sense amplifier 41, 42, 51, 52 in the first or second row assume the high potential Vblh or the low potential Vbll. The bit lines 26, 27 which are connected to the sense amplifiers 56, 57 in the third row simultaneously have the center potential Vbleq. However, as a result of capacitive coupling between bit lines 16, 17 which are connected to sense amplifiers 41, 42 in the first row and bit lines 26, 27 which are connected to sense amplifiers 56, 57 in the third row, the potentials of said bit lines 26, 27 may differ from the center potential Vbleq. This results in the disadvantages described in the introduction.

Figure 2:
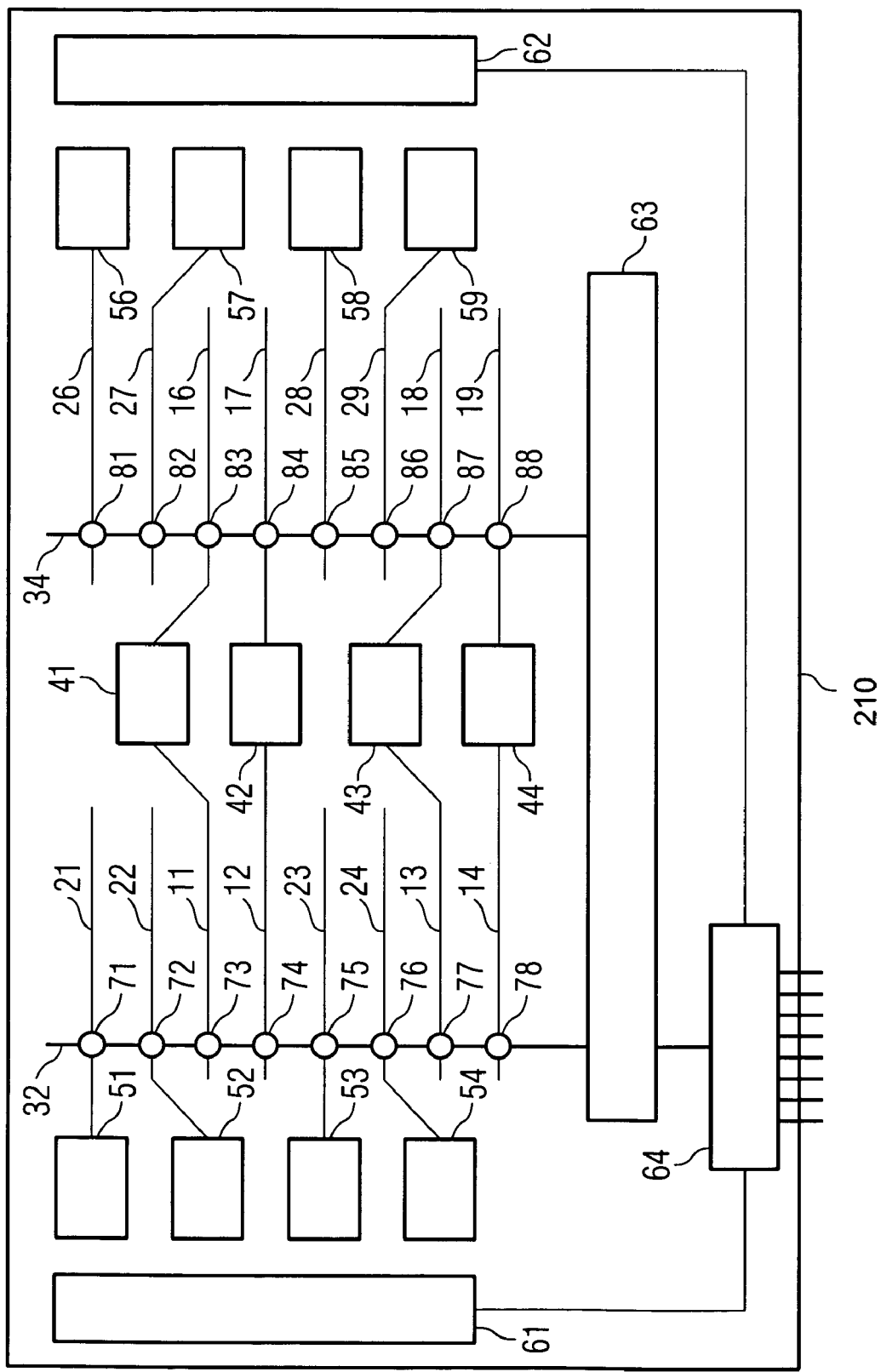
FIG. 2 shows a diagrammatic illustration of a memory component in accordance with a first exemplary embodiment of the present invention.

FIG. 2 is a diagrammatic illustration of a first exemplary embodiment of the present invention. In contrast to the illustration in FIG. 1, twice the number of bit lines 11 to 14, 16 to 19, 21 to 24, 26 to 29 and twice the number of sense amplifiers 41 to 44, 51 to 54, 56 to 59 are illustrated. However, the actual number of these elements is again arbitrary and is preferably considerably higher than illustrated in FIG. 2.

The memory component in accordance with the first exemplary embodiment illustrated in FIG. 2 differs from the memory component illustrated in FIG. 1 by virtue of the fact that 2 bit lines which are connected to sense amplifiers in the same row are respectively arranged directly adjacent to one another. Each bit line 11 to 14, 16 to 19, 21 to 24, 26 to 29 is therefore directly adjacent to, at most, one other bit line which is connected to a sense amplifier 41 to 44, 51 to 54, 56 to 59 in another row.

Adjacent bit lines which are connected to sense amplifiers in the same row are simultaneously either active bit lines or reference bit lines or are simultaneously neither active bit lines nor reference bit lines. In the case of the memory component 210 illustrated in FIG. 2, a bit line which, at one moment in time, is neither an active bit line nor a reference bit line can, at the same moment in time, be directly adjacent to, at most, one bit line which is an active bit line or a reference bit line. In comparison with the memory component illustrated in FIG. 1, disruptive capacitive couplings between bit lines are therefore only half as severe.

FIG. 3 is a diagrammatic illustration of a memory component 310 in accordance with a further exemplary embodiment of the present invention. This exemplary embodiment differs from the first exemplary embodiment (described above with reference to FIG. 2) by virtue of the fact that the bit lines are arranged in groups of four 11 to 14 and 16 to 19 and 21 to 24 and 26 to 29. To put it another way, four bit lines 11 to 14 or 16 to 19 or 21 to 24 or 26 to 29 which are connected to sense amplifiers 41 to 44 or 51 to 54 or 56 to 59 in the same row are respectively arranged directly next to one another.

Half of the bit lines, namely those bit lines 12, 13, 17, 18, 22, 23, 27, 28 which are arranged within the groups of four, are not at all directly adjacent to other bit lines which are connected to sense amplifiers in another row. The other half of the bit lines, namely those bit lines 11, 14, 16, 19, 21, 24, 26, 29 which are arranged at the edges of the groups of four, are respectively directly adjacent to, at most, one other bit line which is connected to a sense amplifier in another row. The problem of capacitive coupling between bit lines which, at one moment in time, are active bit lines or reference bit lines and bit lines which, at the same moment in time, are neither active bit lines nor reference bit lines is therefore again considerably reduced in comparison with the first exemplary embodiment described above with reference to FIG. 2.

It is obvious that the advantages described above with reference to the exemplary embodiments can also be achieved using groups of three bit lines or using arbitrary larger groups of bit lines. The larger each group of bit lines which are connected to sense amplifiers in one and the same row, the lower the proportion of those bit lines which are directly adjacent to a bit line that is connected to a sense amplifier in another row.

While the foregoing is directed to embodiments of the present invention, other and further embodiments of the invention may be devised without departing from the basic scope thereof, and the scope thereof is determined by the claims that follow.

What is claimed is:

1. A memory component, comprising:
a plurality of bit lines arranged in a plurality of columns;
a plurality of word lines arranged in a plurality of rows substantially perpendicularly to the plurality of columns;
a plurality of memory cells are disposed at respective intersections of each bit line and each word line; and
a plurality of sense amplifiers arranged in a plurality of rows, wherein the sense amplifiers of each row are arranged into groups of adjacent sense amplifiers which are connected to respective adjacent bit lines, wherein each group comprises at least three adjacent sense amplifiers and a corresponding number of adjacent bit lines, and wherein there are no intervening bit lines at any point between the adjacent bit lines along their respective lengths; and
wherein the bit lines between a first and second adjacent rows of sense amplifiers are arranged into groups, each group comprising at least three adjacent bit lines, and connected in an interleaved arrangement, wherein the groups of bit lines are connected in an alternating manner to respective adjacent sense amplifiers of the first row and respective adjacent sense amplifiers of the second row.

2. A memory component, comprising:
a plurality of bit lines arranged in a plurality of columns;
a plurality of word lines arranged in a plurality of rows substantially perpendicularly to the plurality of columns;
a plurality of memory cells are disposed at respective intersections of each bit line and each word line; and
a plurality of sense amplifiers arranged in a plurality of rows, wherein the sense amplifiers of each row are arranged into groups of adjacent sense amplifiers which are connected to respective adjacent bit lines, wherein each group comprises at least three adjacent sense amplifiers and a corresponding number of adjacent bit lines, and wherein there are no intervening bit lines at any point between the adjacent bit lines along their respective lengths;
wherein the bit lines between a first and second adjacent rows of sense amplifiers are arranged into groups, each group comprising at least three adjacent bit lines, and connected in an interleaved arrangement, wherein the groups of bit lines are connected in an alternating manner to respective adjacent sense amplifiers of the first row and respective adjacent sense amplifiers of the second row; and
wherein the bit lines between the first row and a third row of sense amplifiers are arranged into groups, each group comprising at least three adjacent bit lines, and connected in an interleaved arrangement, wherein the groups of bit lines are connected in an alternating manner to respective adjacent sense amplifiers of the first row and respective adjacent sense amplifiers of the third row.

3. A memory component, comprising:
a plurality of bit lines arranged in a plurality of columns;
a plurality of word lines arranged in a plurality of rows substantially perpendicularly to the plurality of columns;
a plurality of memory cells are disposed at respective intersections of each bit line and each word line; and
a plurality of sense amplifiers arranged in a plurality of rows, wherein the sense amplifiers of each row are arranged into groups of adjacent sense amplifiers which are connected to respective adjacent bit lines, wherein each group comprises at least three adjacent sense amplifiers and a corresponding number of adjacent bit lines, and wherein there are no intervening bit lines at any point between the adjacent bit lines along their respective lengths;

wherein the bit lines between a first and second adjacent rows of sense amplifiers are arranged into groups, each group comprising at least three adjacent bit lines, and connected in an interleaved arrangement, wherein the groups of bit lines are connected in an alternating manner to respective adjacent sense amplifiers of the first row and respective adjacent sense amplifiers of the second row;

wherein the bit lines between the first row and a third row of sense amplifiers are arrangd into groups, each group comprising at least three adjacent bit lines, and connected in an interleaved arrangement, wherein the groups of bit lines are connected in an alternating manner to respective adjacent sense amplifiers of the first row and respective adjacent sense amplifiers of the third row; and wherein each sense amplifier of the first row is connected to one respective bit line between the first row and the second row of sense amplifiers and to one respective bit line between the first row and the third row of sense amplifiers.

4. A memory component, comprising:

a plurality of bit lines arranged in a plurality of columns;

a plurality of word lines arranged in a plurality of rows substantially perpendicularly to the plurality of columns;

a plurality of memory cells are disposed at respective intersections of each bit line and each word line; and a plurality of sense amplifiers arranged in a plurality of rows, wherein the sense amplifiers of each row are arranged into groups of adjacent sense amplifiers which are connected to respective adjacent bit lines, wherein each group comprises at least three adjacent sense amplifiers and a corresponding number of adjacent bit lines, and wherein there are no intervening bit lines at any point between the adjacent bit lines along their respective lengths;

wherein the bit lines between a first and second adjacent rows of sense amplifiers are arranged into groups, each group comprising at least three adjacent bit lines, and connected in an interleaved arrangement, wherein the groups of bit lines are connected in an alternating manner to respective adjacent sense amplifiers of the first row and respective adjacent sense amplifiers of the second row;

wherein the bit lines between the first row and a third row of sense amplifiers are arranged into groups, each group comprising at least three adjacent bit lines, and connected in an interleaved arrangement, wherein the groups of bit lines are connected in an alternating manner to respective adjacent sense amplifiers of the first row and respective adjacent sense amplifiers of the third row;

wherein each sense amplifier of the first row is connected to one respective bit line between the first row and the second row of sense amplifiers and to one respective bit line between the first row and the third row of sense amplifiers; and wherein the respective bit lines which are connected to the sense amplifiers in the first row are respectively arranged directly adjacent to at most one bit line connected to one sense amplifier arranged in one of the second row and the third row.

* * * * *